United States Patent
Stafanov et al.

(10) Patent No.: US 9,443,845 B1
(45) Date of Patent: Sep. 13, 2016

(54) TRANSISTOR BODY CONTROL CIRCUIT AND AN INTEGRATED CIRCUIT

(71) Applicant: FREESCALE SEMICONDUCTOR, INC., Austin, TX (US)

(72) Inventors: Evgueniy Stafanov, Vieille Toulouse (FR); Edouard Denis De Fresart, Tempe, AZ (US); Hubert Michel Grandry, Espanes (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/870,311

(22) Filed: Sep. 30, 2015

(30) Foreign Application Priority Data

Feb. 23, 2015 (WO) .................. PCT/IB2015/001389

(51) Int. Cl.
  *H03K 3/01* (2006.01)
  *H01L 27/07* (2006.01)
  *H03K 17/687* (2006.01)
  *H01L 29/78* (2006.01)

(52) U.S. Cl.
  CPC ....... *H01L 27/0727* (2013.01); *H01L 29/7827* (2013.01); *H03K 17/687* (2013.01)

(58) Field of Classification Search
  CPC .................. H03K 2217/0018; H03K 19/0016; H03K 19/00384; G05F 3/205; G11C 5/146
  USPC ................................ 327/534, 535
  See application file for complete search history.

(56) References Cited

U.S. PATENT DOCUMENTS

| | | | |
|---|---|---|---|
| 5,682,050 A | | 10/1997 | Williams |
| 5,767,733 A | * | 6/1998 | Grugett ........................ 327/534 |
| 5,945,708 A | | 8/1999 | Tihanyi |
| 6,043,965 A | | 3/2000 | Hazelton et al. |
| 6,650,520 B2 | | 11/2003 | He |
| 7,282,406 B2 | | 10/2007 | Grivna et al. |
| 7,283,343 B2 | | 10/2007 | Grose et al. |
| 7,297,603 B2 | | 11/2007 | Robb et al. |

(Continued)

FOREIGN PATENT DOCUMENTS

| EP | 1887698 A2 | 2/2008 |
|---|---|---|
| EP | 2 533 246 A1 | 12/2012 |

(Continued)

OTHER PUBLICATIONS

U.S. Appl. No. 14/870,333, filed Sep. 30, 2015, not yet published.

(Continued)

*Primary Examiner* — Quan Tra
(74) *Attorney, Agent, or Firm* — Charlene R. Jacobsen

(57) ABSTRACT

An integrated circuit comprises a transistor body control circuit for controlling a body of a bidirectional power transistor. The transistor body control circuit comprises switches connected between a body terminal and a first current terminal, with a control terminal for controlling the current flowing through the switch.
The control terminal of the switch is connected to alternating current, AC capacitive voltage divider. The AC capacitive voltage dividers are connected to the control terminals and arranged to control the switches to switch the voltage of the body terminal as a function of the voltage between the first current terminal and the second current terminal. The integrated circuit further comprises a bi-directional power transistor connected to the transistor body control circuit.

20 Claims, 3 Drawing Sheets

(56) References Cited

U.S. PATENT DOCUMENTS

| | | | |
|---|---|---|---|
| 7,508,277 B2 | 3/2009 | Kuo et al. | |
| 7,537,970 B2 | 5/2009 | Robb et al. | |
| 7,910,409 B2 | 3/2011 | Robb et al. | |
| 8,049,568 B2 | 11/2011 | Youssef et al. | |
| 8,101,969 B2 | 1/2012 | Robb et al. | |
| 8,120,984 B2 * | 2/2012 | Huang et al. | 365/226 |
| 8,269,263 B2 | 9/2012 | Li et al. | |
| 8,431,989 B2 | 4/2013 | Bhalla et al. | |
| 8,530,284 B2 | 9/2013 | Robb et al. | |
| 8,541,833 B2 | 9/2013 | Schulze et al. | |
| 8,642,425 B2 | 2/2014 | Burke et al. | |
| 8,653,587 B2 | 2/2014 | Hsieh | |
| 8,907,394 B2 | 12/2014 | Hossain | |
| 8,947,156 B2 * | 2/2015 | Stultz et al. | 327/534 |
| 9,123,559 B2 | 9/2015 | Meiser et al. | |
| 9,159,786 B2 | 10/2015 | Chen | |
| 9,269,779 B2 | 2/2016 | Deng et al. | |
| 2001/0043112 A1 | 11/2001 | Voldman | |
| 2007/0004116 A1 | 1/2007 | Hshieh | |
| 2008/0111642 A1 | 5/2008 | Bohorquez | |
| 2012/0083075 A1 | 4/2012 | Robb et al. | |
| 2012/0326227 A1 | 12/2012 | Burke et al. | |
| 2014/0009212 A1 * | 1/2014 | Altunkilic et al. | 327/427 |
| 2014/0084362 A1 | 3/2014 | Schloesser et al. | |
| 2014/0367773 A1 | 12/2014 | Poelzl | |
| 2015/0028416 A1 | 1/2015 | Zundel | |
| 2015/0069610 A1 | 3/2015 | Grivna | |
| 2015/0102403 A1 | 4/2015 | Kuruc et al. | |
| 2015/0145030 A1 | 5/2015 | Meiser et al. | |
| 2015/0162324 A1 | 6/2015 | Mauder et al. | |
| 2016/0126348 A1 | 5/2016 | Deng et al. | |

FOREIGN PATENT DOCUMENTS

| | | |
|---|---|---|
| WO | 95/30277 | 11/1995 |
| WO | 00/19540 | 4/2000 |
| WO | 2015/028838 A1 | 8/2013 |
| WO | 2015/028838 A1 | 3/2015 |

OTHER PUBLICATIONS

Restriction Requirement mailed Mar. 22, 2016 for U.S. Appl. No. 14/870,333, 6 pages.
Notice of Allowance mailed for U.S. Appl. No. 14/870,333 13 pages, (Jun. 13, 2016).
U.S. Appl. No. 15/132,855, filed Apr. 19, 2016, not yet published.
U.S. Appl. No. 14/994,197, filed Jan. 13, 2016, not yet published.
Extended European Search Report for appl. 15199239.3 (Jul. 7, 2016).

* cited by examiner

US 9,443,845 B1

TRANSISTOR BODY CONTROL CIRCUIT AND AN INTEGRATED CIRCUIT

CROSS REFERENCE TO RELATED APPLICATION(S)

The present application claims priority to International Patent Application No. PCT/IB2015/001389, entitled "TRANSISTOR BODY CONTROL CIRCUIT AND AN INTEGRATED CIRCUIT," filed on Feb. 23, 2015, the entirety of which is herein incorporated by reference.

FIELD OF THE INVENTION

This invention relates to a transistor body control circuit and an integrated circuit.

BACKGROUND OF THE INVENTION

Bi-directional switches switch high currents through their conduction electrodes while blocking high voltages applied to the conduction electrodes. Bi-directional switches are used in a variety of electrical systems. A typical bi-directional switch is specified to supply high currents, which can range from several Amperes of maximum current to several hundreds of Amperes depending on the specific switch and application, while blocking relatively high voltages, e.g. of at least 25 V without breaking down.

Bi-directional switches are typically implemented using electromechanical switches or a configuration of semiconductor devices, e.g. power transistors. However, standard power transistors have no technically meaningful blocking voltage in one direction, making them unidirectional devices. Consequently, current bi-directional switches typically are implemented using two separate serially coupled power MOSFETs. The separate MOSFETs are formed on separate semiconductor dice, and often housed in separate packages, which results in a high manufacturing cost and a large area occupied on a circuit board. When the separate MOSFET dice are housed in a single package and interconnected with wire bonds, the area occupied on a circuit board is reduced but the manufacturing cost is still too high for many applications.

U.S. Pat. Nos. 7,282,406, 7,297,603, 7,537,970, 7,910,409, 8,101,969 and 8,530,284 all disclose an integrated circuit with several different transistors integrated on the same circuit, including a p-channel bi-directional trench power transistor for battery charging protection. The transistor comprises two vertical trenches between which a body is present. The body is separated from current carrying electrodes above and below the body by high-voltage regions with a lesser doping concentration than the electrodes. However, this bi-directional trench power transistor has an inherent parasitic bipolar transistor formed by the body and the high voltage regions. Furthermore, it is not suitable for operation with high voltages, such as of at least 20 or more, e.g. up to 40 V or more, and/or high currents, e.g. above 1 mA, up to 1 A or more.

U.S. Pat. No. 8,101,969 discloses a body bias switch including two MOSFETs connected in parallel to the native diodes in the bi-directional trench power transistor. The MOSFETs are integrated on the same die as the bi-directional trench power transistor. When the drain voltage is the highest voltage (i.e. out of the drain voltage and the source voltage), the body is referenced to the source voltage, and vice versa when the source voltage is the highest voltage, the body is referenced to the drain voltage. However, this bias switch comes with a risk of over-voltages damaging the MOSFETs since the gates of the MOSFETs are connected directly to the drain and source respectively. Accordingly, in case the maximum drain-source voltages of the bidirectional transistor exceed the breakdown voltages of the MOSFETs the latter risk irreversible damage.

SUMMARY OF THE INVENTION

The present invention provides a transistor body control circuit and an integrated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention can for the most part, be implemented using electronic components and circuits known to those skilled in the art, details will not be explained in any greater extent than that considered necessary as illustrated for the understanding and appreciation of the underlying concepts of the present invention and in order not to obfuscate or distract from the teachings of the present invention.

Figure 1:
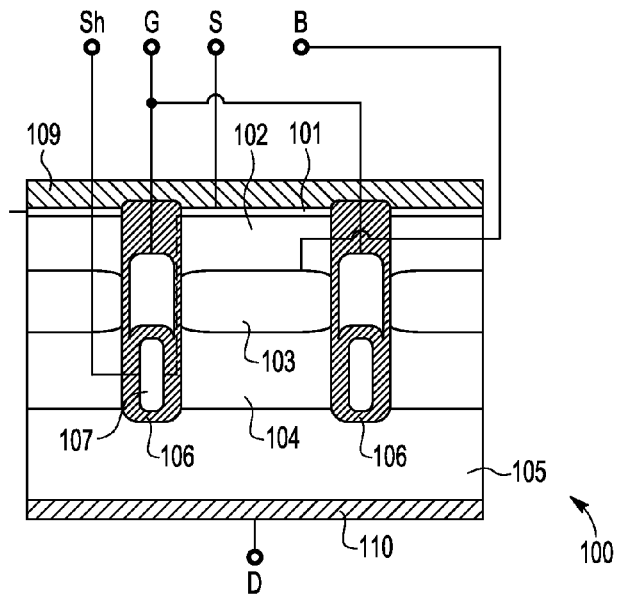
FIG. 1 schematically shows a cross-sectional view of an example of an embodiment of a bidirectional power transistor.

FIG. 1 shows an example of a bidirectional power transistor 100. The power transistor 100 shown in FIG. 1 is a bi-directional transistor, as is explained below in more detail, which can support high energies, i.e. high currents and/or voltages both from the source towards the drain and vice-versa and. The power transistor can for example have a current maximum of more than 1 A, such as 10 A or more, such as 100 A or more, such as at least 200 A and/or a positive drain-source break down voltage of at least 25 V, for example 50 V or more, and a negative drain-source break down voltage of at least 25 V, for example 30 V or more, such as 50 V or more, for example 100 V or more, e.g. 300 V or more.

Figure 2:
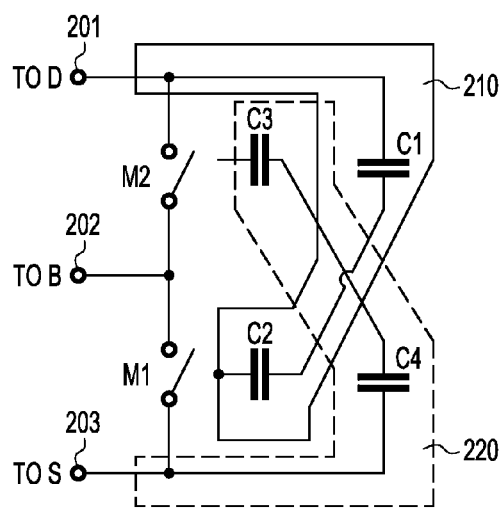
FIG. 2 shows a circuit-diagram of a first example of a transistor body control circuit suitable for the example of FIG. 1
Figure 3:
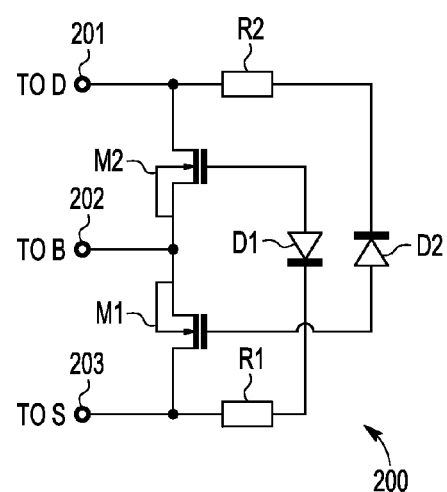
FIG. 3 shows a circuit-diagram of a second example of a transistor body control circuit suitable for the example of FIG. 1
Figure 4:
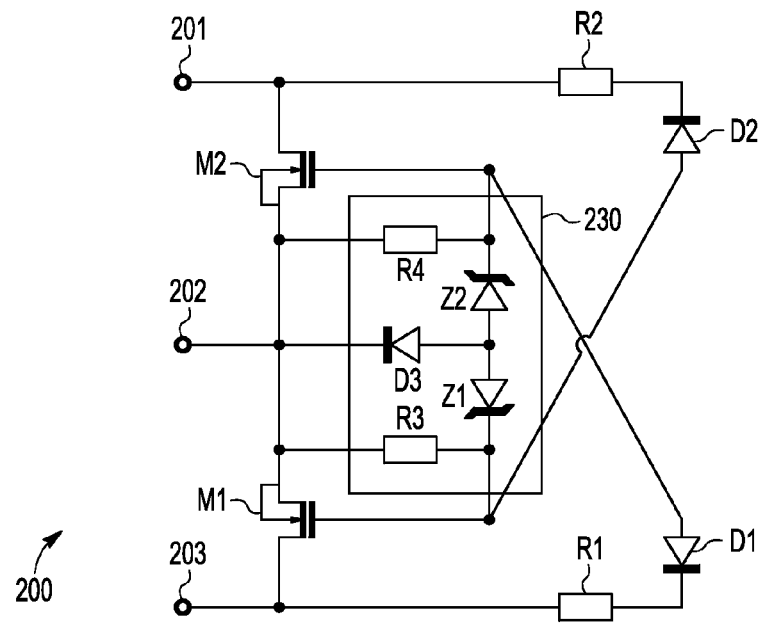
FIG. 4 shows a circuit-diagram of a third example of a transistor body control circuit suitable for the example of FIG. 1
Figure 6:
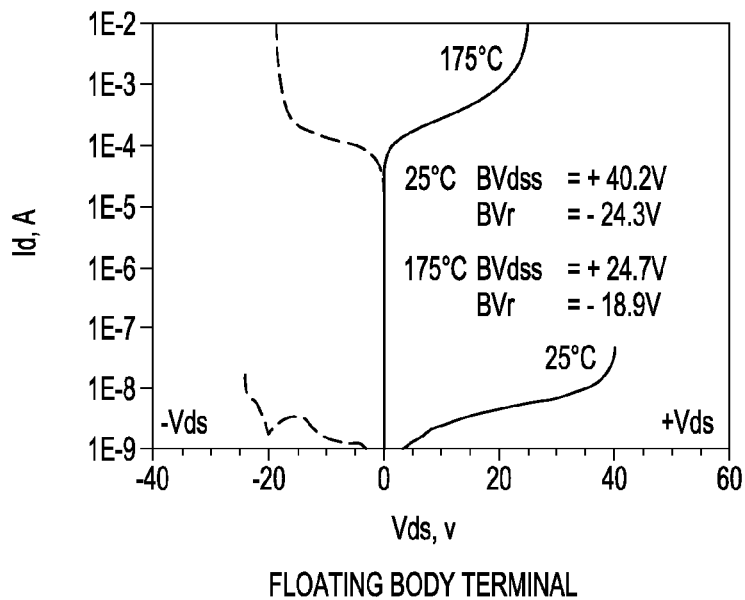
FIG. 6 shows a graph illustrating simulated current-voltage characteristics of a bidirectional power transistor without a transistor body control circuit.
Figure 7:
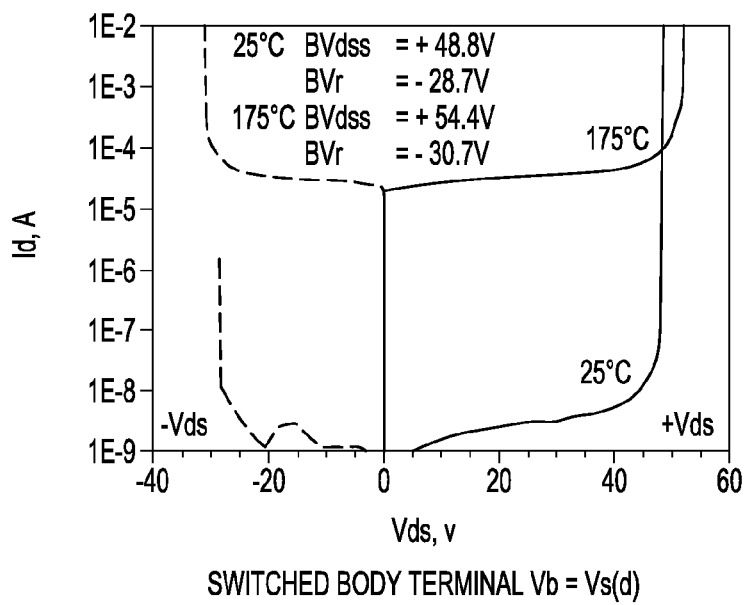
FIG. 7 shows a graph illustrating simulated current-voltage characteristics of a bidirectional power transistor with a transistor body control circuit.

FIGS. 2-4 show circuits suitable to switch the body 103. As illustrated with the I-V characteristics in FIGS. 6 and 7, in which the breakdown voltage in drain to source direction is denoted with BVdss and in the reverse direction with BVr, the bi-directional transistor will exhibit higher breakdown voltages in both directions when the body 103 is actively switched to the source or drain voltage, compared to a body of which the potential is left floating. This is observed both at ambient temperature (25 degrees Celsius) and becomes even more significant at elevated temperatures (175 degrees Celsius).

Accordingly, the transistor body control circuit allows to improve the breakdown voltages. The transistor body control circuit shown in FIGS. 2-4 comprises first and second switches M1, M2, e.g. field effect transistors operated in switched mode, connectable between the body terminal B and a respective one of the first and second current terminals D,S of the bidirectional power transistor. The current flowing through the switches M1, M2 can be controlled through a respective control terminal, e.g. a gate, of the switch M1, M2. The control terminal of the first switch is connected to a first alternating current or transient, hereinafter AC, capacitive voltage divider 210 and the control terminal of the second switch is connected to a second AC capacitive voltage divider 220. The AC capacitive voltage divides 210,220 are connectable to the current terminals D,S of the transistor, as shown the AC capacitive voltage dividers 210,220 are connected between respective contacts 201,203 of the circuit 200 connectable to the current terminals D,S. The AC capacitive voltage dividers 210,220, when in operation, control the switches M1, M2 to switch the voltage of the body terminal to the first current terminal or the second current terminal as a function of the voltage between the first current terminal and the second current terminal. The AC capacitive voltage dividers reduce the risk that the switches M1, M2 are damaged by a too high voltage applied to the current terminals D,S because at the control terminal of the switches M1, M2 a voltage will be applied that is only a fraction of the voltage between the current terminals D,S.

Referring back to FIG. 1, the example of a bidirectional power transistor shown therein comprises a first current terminal 105, e.g. a drain, and a second current terminal 101, e.g. a source. An electrical path is present between the first current terminal 105 and the second current terminal 101, through a first drift region 104, a body 103 and a second drift region 102. The electrical path can be selectively enabled or disabled to allow current to flow in a first direction, e.g. from the first current terminal to the second terminal or a second direction, opposite to the first direction, by applying suitable signals and power to the electrodes B, D, G, Sh and S, which are connected to parts 101,103,105,107,108 of the power transistor.

The power transistor 100 comprises a first current electrode, e.g. in this example the drain electrode D, which is connected to a first current terminal 105, e.g. the drain, of the power transistor 100. A second current electrode S, e.g. the source electrode, is connected to a second current terminal 101, e.g. the source, of the power transistor shown. A gate or control electrode G is connected to the control terminal, e.g. gate 108, of the power transistor 100. As shown in the example of FIG. 1, the semiconductor product can further comprise a body electrode B connectable to an external power supply and connected to the body 103 of the power transistor 100. A separate shield electrode Sh is provided via which the voltage of the shield plate 107 can be controlled separately from the voltage and/or current of the other electrodes. However, the second current electrode S can alternatively be connected to the shield plate 107 of each of the power transistors 100, as indicated in FIG. 1 with the dashed line and hence the voltage of the shield plate be coupled to the second current terminal.

In FIG. 1 a cross-sectional view is shown to explain the bidirectional operation of the bidirectional power transistor, but it will be apparent that the transistor has an elongated finger like shape and that the different electrodes may connect to the respective element at a location of the finger suitable for the specific implementation and not necessarily at the section shown in FIG. 1, e.g. the body 103 may be connected at opposite ends of the finger to the body electrode B, the source 101 to the source electrode S at the opposite ends of the finger and a position in the middle of the finger, etc.

It should be apparent that in FIG. 1 only a single transistor or "cell" is shown, and that an actual semiconductor product can comprise an arrangement of a plurality of these cells. Depending on the specific implementation, the product can comprise several tens, hundreds, thousands or more cells in a suitable arrangement (e.g. 2-dimensional matrix) and connected in parallel to form a single power transistor device. The product can for example be implemented as described in applicant's co-pending International Patent Application PCT/IB2013/002209, the entire contents of which are incorporated herein by reference. In case the product comprises a plurality of cells, the terminals of each of the different cells can be connected to the electrodes, to allow the different cells to be controlled simultaneously to conduct current through a layer stack from a first current terminal 101 to a second current terminal 105 or vice versa. Each of the electrodes or feeds B, D, G, Sh and S present in the semiconductor product is connectable to external circuitry, such as a power supply or control logic circuitry, not shown. The connection between the electrodes and feed and the external circuitry can be provided in any conventional manner, and is not described in further detail.

The power transistor 100 can be used to control the flow of current. The shown example of power transistor can for example be used in a method for operating a power transistor as described below, although it will be apparent that other types of bi-directional power transistors can be used as well to perform such a method and that the power transistor can be used in other methods. The power transistor can be operated intermittently in a first direction or a second direction, i.e. bi-directional. The bi-directional power transistor can be symmetric with positive and negative break down voltages that have the same absolute value, or be asymmetric, with different values, depending on the specific implementation. For instance, depending on the specific implementation the thickness of the first and/or second drift region can be adapted to obtain a breakdown voltage for the specific implementation. For an asymmetric transistor, a suitable positive breakdown voltage has found to be between 1.5 and 2 times that of the negative breakdown voltage, such as 45 V for a 25 V negative breakdown voltage.

The bi-directional nature of the power transistor 100 will now be described in operation, using the example of an n-type power transistor. In a first direction and in respect of switching the power transistor 100 on, a positive voltage (relative to the source) can be applied to the drain electrode D. The body electrode B can be connected to the source electrode S, so as to electrically couple the body 103 to the source 101 of the transistor 100, as explained below in more detail with reference to the operation of the circuits shown in FIGS. 2-4. To the shield plate a voltage lower than the voltage of the drain electrode (e.g. 0 V or the source voltage if the drain electrode is at a positive voltage) can then be provided to shield the gate from the voltage applied to the drain electrode D. By applying a positive gate-source bias voltage, Vgs>0 V, to the gate electrode G by an external gate driver circuit (not shown) a depletion field effect can be caused through the gate dielectric at an interface between the body 103 and the first and second trenches 106 in which the gate 108 is provided. When the gate bias voltage exceeds a threshold voltage Vth, an inversion conducting n-layer is formed along the interface of the trench 106 and the body 103, which conducts the majority of carriers injected from the source 101 to be collected by the drain 105.

In an off-state, a positive voltage can be applied to the drain 105. The body 103 can still be electrically tied to the source and so be subjected to a source potential. The gate bias voltage can be set to a lowest potential, e.g. Vgs=0 V. A first depletion layer can be formed around a bottom p-n junction formed by the interface of the body 103 and the first drift region 104. By increasing the drain-source bias voltage, Vds, a first space charge region of the depletion layer can increase to the low-doped bottom part of the first drift region 104. The electrical field in the region thereby increases and when a critical field is reached, an avalanche phenomena by carrier impact ionization can be observed causing breakdown of the reverse biased junction mentioned above.

In the second direction and in relation to an on-state, the body electrode can be set such that the drain potential is coupled to the body 103, as explained below in more detail with reference to the operation of the circuits shown in FIGS. 2-4. A positive voltage can be applied to the source 101. In the second direction, a positive bias voltage, e.g. the source voltage, can be provided to the shield plate and the gate biased relative to the drain 105. This allows to reduce the electrical field in at least a part of the first drift region 104, and accordingly the breakdown voltage can be increased.

A positive gate bias voltage, Vgd>0 V, can be applied to the gate by the external gate driver circuit, thereby causing a depletion field effect through the gate dielectric into the body along the inner sidewalls of the trenches 106. When the gate bias voltage exceeds the threshold voltage Vth an inversion conducting layer can be formed along the interface of the trench dielectric and the body, which can conduct the majority of the carriers injected from the substrate 102 and collected by the source 101.

In an off state, a positive voltage can be applied to the source 101. The body 103 can still be electrically tied to the potential of the drain. The gate-drain bias voltage, Vgd, can be set to the lowest potential, namely, Vgd=0V. A second depletion layer can be formed around a top p-n junction formed by the interface of the body and the second drift region 102. By increasing the source-drain bias voltage, Vsd, a second space charge region of the depletion layer can increase to the low-doped top part of the second drift region 102. The electrical field in the region can thereby increase and when a critical field is reached, an avalanche phenomena by carrier impact ionization can be observed causing breakdown of the reverse biased junction mentioned above, thereby implementing the blocking voltage.

In the example of FIG. 1, the first current terminal 105 is formed in a wafer substrate. On the bottom of the substrate, also referred to as the back-side, a metal layer 110 is provided which constitutes the electrode for the first current terminal 105 and allows to connect the first current terminal 105 to an external voltage or current supply. A suitably patterned and structured layer stack has been provided on top-side of the substrate and the other components of the power transistor 100 are formed in the layer stack e.g. by processing, such as successive patterning, doping, deposition, etching, etc of the stack. The top surface of the layer stack is covered by a passivation layer 109 of a suitable dielectric material. The passivation layer 109 shields the rest of the power transistor 100 from ambient influences, such as oxidations or otherwise.

The layer stack can be implemented in any manner suitable for the specific implementation. In the shown example, the layer stack 102 comprises a bulk layer of a base material of the first conductivity type with a concentration of majority charge carriers equal to a concentration in the first drift region or in the second drift region. The bulk layer is provided with one or more doped layers in which the doping differs from the base material, e.g. in conductivity type and/or concentration of majority charge carriers. Thus, in the example the layers of the layer stack 102 are formed from the same base material. The doped layers in the bulk layer can for example comprise one or more of the group consisting of: a buried layer of the second conductivity type, in which the body is present; a source layer of the first conductivity type with a concentration of majority charge carriers higher than the base material, in which the second current terminal is present, the source layer is separated from the buried layer by a drift layer of the base material which the second drift region is present; a drain layer of the first conductivity type with a concentration of majority charge carriers higher than the base material, in which the first current terminal is present, the drain layer is separated from the buried layer by a drift layer of the base material in which the first drift region is present. However, alternatively, the layer stack can comprise a plurality of different layers of different base materials, for example individually grown on top of each other during consecutive phases of manufacturing of the power transistor.

In the example of FIG. 1, in the stack 102 vertical trenches 106 are present in which the gate is buried and the bidirectional power transistor is a bidirectional vertical trench field effect power transistor. Each of the vertical trenches 106 extends in the vertical direction from a top layer of the stack towards the first current terminal 105. The power transistor is defined in lateral direction by the vertical trenches. Hereinafter, the vertical sidewalls of the trenches 106 closest to, and facing towards, the body 103 are referred to as the inner sidewalls and the vertical sidewalls facing away from the body are referred to as the outer sidewalls. The inner sidewalls of the vertical trenches 106 confine the current laterally and thus form the lateral boundaries of the current path.

In the shown example, each of the first and second vertical trenches 106 comprises a gate electrode 108 in a first part of the vertical trench 106. The gate electrode 108 is electrically isolated from the body 103 by a gate dielectric, in this example formed by a gate dielectric layer lining the inner sidewall in a first part of the trench. The gate electrode 108 is coupled to the body 103 and, when a suitable voltage is applied to the gate, e.g. through the gate electrode, a vertical conductive channel is formed in the body 103. Through the vertical channel a current can flow from the first drift region 104 to the second drift region 102, when the first current terminal 105 is at a positive voltage with respect to the second current terminal 101, or vice versa when the second current terminal 101 is at a positive voltage with respect to the first current terminal 105.

The first and second vertical trenches 106 extend, in the vertical direction, from the top layer beyond an upper boundary of the first drift region 104, and in a lateral direction parallel to the substrate top-surface electrically isolate, and define, the first drift region 104. Thereby, the risk on an unexpected breakdown of a transistor 100 can be reduced. Without being bound to theory, it is believed that unexpected breakdown can be caused by voltage and/or current events in other power transistors (e.g. adjacent cells) or devices. Furthermore, it is believed that by isolating the first drift region 104 in the lateral direction, switching speed can be increased since the gate-drain capacitance is reduced drastically and less charge carriers need to be recombined when switching off, i.e. only those in the region between the first and second vertical trenches 106, rather than in the entire drift region.

The vertical trenches 106 further comprise a shield plate 107. The shield plate 107 is capable of generating a vertical accumulation layer in the first drift region 104, e.g. along the inner sidewall of the trench, at the interface between the first drift region 104 and the vertical trench 106 when the voltage shield plate 107 is biased with respect to the voltage of the first current terminal 105 in a first polarity. For example, in case the first current terminal is an n-doped semiconductor material, the accumulation layer can be generated when the shield plate 107 is sufficiently positively biased. In case the first current terminal is a p-doped semiconductor material, the accumulation layer can be generated when the shield plate 107 is sufficiently negatively biased. In the shown examples the accumulation layer will extend in vertical direction through the whole first drift region, from the bottom limit of the body region 103 up to the first current terminal 105. Thus, a conductive path between the body and the first current terminal 105 can be established in a relatively fast manner. However, depending on the specific implementation, the accumulation layer can extend in vertical direction through a part of the first drift region 104 only, and e.g. be spaced from the body or the first current terminal. The shield plate 107 can further locally reduce the electrical field density in parts of the first drift region when the shield plate is biased with respect to the first current terminal in a second polarity. For example, in case the first current terminal is an n-doped semiconductor material, the reduction is obtained when the shield plate 107 is sufficiently negatively biased. For example, in case the first current terminal is an n-doped semiconductor material, the reduction is obtained when the shield plate 107 is sufficiently negatively biased. Thus, unexpected breakdown can be reduced because overly high electric fields in the first drift region can be avoided while the speed of switching can be improved since the current path through the drift region can be enabled more rapidly by creating the accumulation layer.

In the shown example, the shield plate 107 is situated in a lower part of the trench 100. This lower part is closer to the first current terminal 105 than the first part. The shield plate 107 is in this example additional to the lateral isolation of the first drift region 104 by the vertical trench 106. However, it should be apparent that the shield plate 107 can be used without the lateral isolation of the first drift region 104, and that the lateral isolation of the first drift region can be used without a shield plate.

The first drift region 104 and the second drift region 102 can be implemented in any manner suitable for the specific implementation. The first and second drift region can be of a first conductivity type having a first type of majority charge carriers, while the body is of a second conductivity type having a second type of majority charge carriers opposite to the first type. For example the drift regions can be n-type semiconductors and the body be a p-type or vice versa.

In the example of FIG. 1, the first drift region 104 extends in lateral direction between the vertical trenches and is defined by the inner sidewalls of the vertical trenches 106. The first drift region 104 extends in vertical direction from the bottom of the body 103 until the top-surface of the substrate 120. Suitable lower limits for the thickness have been found to 2 micron or more, such as 5 micron or more, for example 10 micron or more, and suitable upper limits 10 micron or less, such as 5 micron or less, such as 2 micron or less. The drift region can for example be mono-crystalline, and grown on the substrate through for instance an epitaxial process. The drift region can be of the same material, e.g. Si, as the first current terminal 105 but with a lower doping concentration. A suitable dopant has found to be P or As with a resistivity of 0.05 Ohm*cm or more, e.g. 0.1 Ohm*cm or more, such as 0.2 ohm*cm or more. A suitable upper limit has been found a resistivity of 1 Ohm*cm or less. A particularly effective resistivity has been found to be 0.2 Ohm*cm on average but it will be apparent that other values may be used depending on the desired breakdown voltage of the transistor and that the doping concentration does not need to be uniform over the entire drift region.

The second drift region 102 can, as in the examples, have essentially the same characteristics as the first drift region 104. In the example, the thickness of the second drift region is much less than of the first drift region but the thickness may be more or less the same, depending on the desired breakdown voltage of the bidirectional power transistor. A suitable thickness has found to be 1 micron or more, for example 1.5 micron.

The first current terminal 105 and second current terminal 101 can be implemented in any manner suitable for the specific implementation. The first current terminal 105 is in the example situated, in a vertical direction from a top of the stack towards the first current terminal 105, below the second current terminal 101. In the shown examples, the first and second current terminal 101, 105 are of the same, first, conductivity type as the drift regions 102,104 and opposite to the conductivity type of the body 103. The concentration of majority charge carriers in the first current terminal 105 is higher than in the first drift region 104. The concentration of majority charge carriers in the second current terminal 101 is higher than in the second drift region 102. The current terminals can for example be doped or otherwise be provided with a resistivity which is at least one order of magnitude smaller than the resistivity of the drift regions.

In this example, the first current terminal 105 is of a semiconductor material provided with a dopant of the same type as the first drift region 211 (e.g. an n-type doping or a p-type doping) but a higher concentration. This makes the first current terminal 105 highly conductive compared to the first drift region 104. For instance, the doping concentration can be at least 2.5 orders of magnitude higher than in the drift region, 3 orders or more have been found to be particularly effective. The first current terminal 105 can be any suitable type of substrate such as a mono-crystalline Si substrate with a <100> orientation, and doped with a suitable dopant, such as in case of an N-doped current terminal Arsenic (As), to obtain a resistivity of less than 1 milli Ohm/com, such as less than 0.005 ohm/cm, for example 0.03 Ohm*cm or less.

The second current terminal 101 can be implemented in any manner suitable for the specific implementation, and be of similar constitution as the first current terminal 105, but in terms of conductivity and doping concentration different, for example with a doping concentration which is an order of magnitude higher. In this example, the second current terminal 101 is formed as the area of the top layer of the layer stack between, in lateral direction, the inner sidewalls of the trenches 106 and in vertical direction between the top of the second drift layer 102 and the top-surface of the layer stack (in this example covered by passivation layer 109). However, depending on the specific implementation the second current terminal 101 can be implemented above the top layer, for example by local formation or deposition of a suitable material on the layer stack, in the area in lateral direction between the inner sidewalls of the vertical trenches 106.

The body 103 can be implemented in any manner suitable for the specific implementation. In the shown example, the body is defined in lateral direction by the inner sidewalls of the vertical trenches 106 and in vertical direction between by the bottom of the second drift region, and the top of the first drift region. The body 103 extends laterally between vertical trenches 106. The body 103 extends vertically between the first current terminal 105 and the second current terminal 101. The first drift region 104 thus extends, in the vertical direction, between the body 103 and the first current terminal 105, while the second drift region 102 extends, in the vertical direction, between the body 103 and the second current terminal 101. The body can for example be formed by a doping a semiconductor material, e.g. Si, with a suitable dopant (e.g. p-type if the current terminals 101,105 are of an n-type). A suitable dopant has been found Boron, such as $B_{11}$. A suitable concentration has been found to be 2 orders of magnitude smaller than that of the first current terminal 105.

As mentioned above, the breakdown voltage is increased if the voltage of the body 103 is actively controlled and not left floating. Referring to the examples of body control circuits shown in FIGS. 2-4, the switches M1, M2 are controlled by the AC capacitive voltage dividers such that when the one is open, the other is closed and accordingly the body 103 (when the circuit is connected to the bidirectional power transistor) is either set to the voltage of the first current terminal or of the second current terminal, more specifically to the lowest of the voltages of the first or second current terminal.

Referring to the example of FIG. 2, the body 103 can for example be switched using an AC capacitive voltage divider comprising a chain 210,220 of at least two capacitors C1,C2;C3,C4 respectively. One end of the chain may be connected to a respective one of the contacts 201,203 to respectively receive the voltage of the first current terminal 105 and the second terminal 101. The other end of the chain may be connected the control terminal of a respective switch M1, M2 to set to voltage of that end and hence control the state of the switch to be conductive (closed) or non-conductive (open). The voltage of the node is a fraction of the voltage between the contacts 201,203 and by selecting a suitable ratio of the capacitances (i.e for this example a suitable value for C1/C2 resp. C3/C4) the switch M1 may then be switched to e.g. be closed if the voltage at the contact 201 is positive relative to the voltage of contact 203 and open if the voltage at the contact 201 is negative relative to the voltage of contact 203. Similarly the switch M2 may then be switched to e.g. be open if the voltage at the contact 201 is positive relative to the voltage of contact 203 and closed if the voltage at the contact 201 is negative relative to the voltage of contact 203.

Referring to the example of FIG. 3, the AC capacitive voltage dividers 210,220 may both comprise a series connection of a resistor R1, R2 connectable to a respective current terminal of the transistor and at least two capacitive elements in series. A node between the capacitive elements can be connected to the control terminal and form the divided voltage node.

A capacitive part of the switch M1, M2 to which the AC capacitive voltage divider 210,220 is connected can be used as a capacitive element of the AC capacitive voltage. In this example, the switches M1, M2 are field effect transistors ((FETs), in this example n-type operated in depletion mode, and the inherent capacitance between the gate and body of the FET is used as a capacitive element of the voltage divider, between (in this example) source contact 203 and the divided voltage node for the first switch M1 and between drain contact 201 and the divided voltage node for the second switch M1. Thereby the need for an additional capacitive element in the circuit is avoided, which especially allows to reduce the size of the circuit when it is implemented as an integrated circuit since capacitors occupy a relative large amount of die surface.

The AC capacitive voltage divider in the example of FIG. 4 further has a diode D1 resp. D2 which is used as another capacitive element. The diode is connected with its cathode to the resistor R1,R2 and with an anode to the divided voltage node. Thus, when diode D1 connected to the second switch M2 is in reverse, i.e. the voltage of the source contact 203 is high, the gate of the second switch will receive a divided voltage $V_{g2}$ proportional to the ratio of the gate capacitance and the diode capacitance, and more specifically:

$$V_{g2} \propto \frac{C_{iss}^2}{C_{iss}^2 + C_{D1}} V_{out}$$

where $V_{out}$ is the voltage between drain and source of the power transistor (i.e. the supply voltage 0, and $C_{iss}^2$ is the transistor input capacitance or $C_{gd}^2 + C_{gs}^2$ of the second transistor M2. When the diode D1 is in forward mode (.e. the voltage of the source contact 203 is low) the capacitance of the diode is high and the gate will receive a voltage below the threshold voltage. In this respect, it should be noted that the diode capacitance in reverse is mainly the junction capacitance whereas in the forward mode the diode capacitance is high because the junction capacitance increases due to the narrowing of the depletion layer, and the, far higher, diffusion capacitance adds to that. Accordingly, the AC capacitive voltage divider has a division ratio which varies depending on the polarity of the supply voltage.

The first switch M1 is operated in a similar manner relative to the drain contact 201, depending on the mode of the diode D2 (forward or reverse). Thus, when diode D2 connected to the first switch M1 is in reverse, i.e. the voltage of the drain contact 201 is high, the gate of the first switch M1 will receive proportional to the ratio of the gate capacitance $C_{iss}^1$ and the diode capacitance C and more specifically:

$$V_{g1} \propto \frac{C_{iss}^1}{C_{iss}^1 + C_{D2}} V_{out}$$

where the superscript 1 denotes the first switch M1. When the diode D2 is in forward mode (.e. the voltage of the drain contact 201 is low) the capacitance of the diode is high and the gate will receive a voltage below the threshold voltage.

It will be apparent that a suitable value for the capacitance of the diodes D1,D2 may be set to choosing a suitable size of the diodes. In a practical example, with breakdown voltages roughly similar to FIG. 7, a diode D2 with a breakdown voltage BV of about 35 V when the power transistor has a drain-source breakdown voltage BVdss of about 45 V while for a reverse breakdown voltage BVr of about 30 V diode D1 with a BV of 17 V have shown to effectively protect the switches M1, M2 while avoiding the diodes to breakdown.

Referring to FIG. 4, the transistor body control circuit 200 can further comprise clamp circuitry 230 for clamping the control terminals of the switches M1, M2 relative to the body terminal B to below the breakdown voltage of the control terminal. In the example of FIG. 4, the clamp circuitry 230 comprises Zener diodes Z1,Z2 connected to each other with their anodes, while connected with the cathode to a respective one of the switches M1,M2. The Zener diodes Z1,Z2 clamp the control terminal of the switches M1, M2 relative to their anodes, while the anodes of the Zener diodes Z1,Z2 in turn are clamped relative to the body contact 202 by a diode D3 connected with its cathode to the body contact and with the anode to the anodes of the Zener diodes. The breakdown voltage of the Zener diode plus the forward voltage of the diode D3 are chosen to be below the breakdown voltage of the switches M1, M2, i.e. in case the switches are FETs to be below the gate oxide breakdown voltage BVox. For example, the clamping voltage may be 5 V when the gate oxide breakdown voltage BVox is 8 V.

Furthermore, the control terminals of the switches M1, M2 are connected to the body contact 202 through pull-down resistors R3,R4 which prevents the voltage of the control terminals from floating and thus ensures that the switches are always in a defined state.

Figure 5:
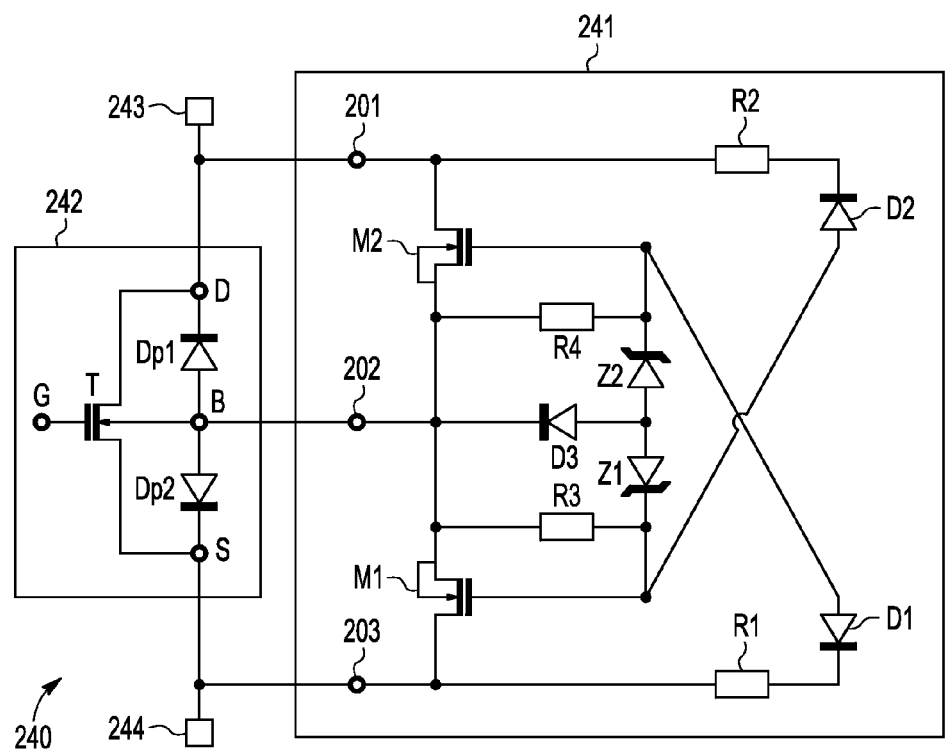
FIG. 5 shows a diagram of an example of an integrated circuit comprising a power transistor and a transistor body control circuit.

Referring now to FIG. 5, the example of an integrated circuit 240 comprises a bi-directional power transistor and a transistor body control circuit. In this example, the transistor body control circuit is implemented as shown in FIG. 4 however it will be apparent that the integrated circuit may use another type of transistor body control circuit, such as those of FIG. 2 or 3. For sake of simplicity, only a single bi-directional power transistor is shown, but it will be apparent that this may consist of an arrangement of a plurality of power transistor cells connected to operate as a single power transistor. As shown in FIG. 5, the bi-directional power transistor has a transistor T which can be opened or closed via the gate G and inherent diodes in common anode connecting the current terminals and having their anodes connected to the body of the transistor. The body of the transistor T is connected with a body terminal B to the body contact 202 of the body control circuit, with the first current or drain terminal D to a drain contact 201 and to an IC contact pin 243 allowing the first current terminal to be connected to an external power or signal source. A second current or source terminal S of the transistor is connected to a source contact 203 of the control circuit and to an IC contact pin 244 allowing the second current terminal to be connected to e.g. a load to be driven by the power transistor 100.

The integrated circuit 240 shown therein comprises two dice 241,242 on which respective electronic circuitry is provided, and more specifically comprises a power die 242 on which the bi-directional power transistor is provided, and a control die 241 on which control circuitry is provided which controls the bi-directional power transistor. In the example, only a body control circuit is shown on the control die 241 but other control circuitry may be present as well, such as control circuitry that becomes active in specific conditions such as overload, over temperature, short circuits, etc. and controls the bi-directional power transistor to operate in a state that avoids permanent damage to the transistor. The AC capacitive voltage divider allows to use a control die with a lower maximum gate-source voltage than the maximum voltage across the source-drain in both directions of the power transistor while avoiding the risk of damage to the switches M1,M2 and accordingly enables a wide variety of choice for the characteristics of the control die 241.

In the foregoing specification, the invention has been described with reference to specific examples of embodiments of the invention. It will, however, be evident that various modifications and changes can be made therein without departing from the scope of the invention as set forth in the appended claims and that the claims are not intended to be limited to the specific examples.

For example, the vertical trench 106 can be implemented in any manner suitable for the specific implementation and have any suitable shape, size and configuration. For instance, trench can be without a shield plate or the trench can be provided with more shield plates, for example with a shield plate above the gate. Also, in the example of FIG. 1 the first and second vertical trenches 106 are very deep trenches which extend from the top of the layer stack into the first current terminal 105, i.e. the substrate in that example. However the vertical trenches can be less deep, and for example extend until the top surface of the first current terminal 105, e.g the bottom of the trench touching the substrate on which the layer stack is provided. Likewise, the vertical trenches can terminate slightly above the first current terminal 105, for example at a vertical position closer to the substrate top surface than to the middle of the vertical drift layer 106, or expressed mathematically dtrench>0.75 ddrift, where dtrench represents the depth of the trench in the drift region, and ddrift the vertical thickness of the drift region. Also, the vertical trenches can be filled, e.g. with the electrodes and dielectrics in any suitable manner.

Furthermore, the semiconductor substrate described herein can be any semiconductor material or combinations of materials, such as gallium arsenide, silicon germanium, silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. For example, the transistor shown in FIG. 1 may be used in an up-side down or rotated position relative to that shown in the drawing without affecting its operation.

Also for example, in one embodiment, the illustrated examples can be implemented as circuitry located on a single integrated circuit or within a same device. For instance, the power die 242 and the control die 241 of the example of FIG. 4 can be implemented as separate dice in a single integrated circuit package, connected using e.g. bondwires or other connecting techniques. Alternatively, the examples can be implemented as any number of separate integrated circuits or separate devices interconnected with each other in a suitable manner. For example, the control circuitry on the control die 241 can be provided outside an integrated circuit package in which the power die 242 is present or the control circuitry composed of at least two separate components, e.g. mounted in a printed circuit board.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A transistor body control circuit for controlling a body of a bidirectional power transistor, comprising:
    a first switch connectable between a body terminal and a first current terminal of the bidirectional power transistor, comprising a control terminal for controlling the current flowing through the first switch;
    a second switch connectable between the body terminal and a second current terminal of the bidirectional power transistor, comprising a control terminal for controlling the current flowing through the second switch;
    the control terminal of the first switch being connected to a first alternating current, AC capacitive voltage divider and the control terminal of the second switch being connected to a second AC capacitive voltage divider; said AC capacitive voltage dividers being connectable to the first control terminal and the second current terminal and arranged to control the first switch and the second switch to switch the voltage of the body terminal to the first current terminal or the second current terminal as a function of the voltage between the first current terminal and the second current terminal.

2. A circuit as claimed in claim 1, where the AC capacitive voltage dividers both comprise a series connection of a resistor connectable to a respective current terminal of the transistor and at least two capacitive elements in series, a node between said capacitive elements being connected to the control terminal.

3. A circuit as claimed in claim 2, wherein the at least one of the first or second AC capacitive voltage divider comprises a diode, a cathode of said diode being connected to said resistor and an anode of said diode being connected to said node.

4. A circuit as claimed in claim 1, wherein for at least one of the first or second AC capacitive voltage divider a capacitive part of the switch to which the divider is connected forms a capacitive element of said AC capacitive voltage divider connecting the control terminal and the respective current terminal.

5. A circuit as claimed in claim 1, further comprising clamp circuitry for clamping the control terminals relative to said body terminal to below the breakdown voltage of the control terminal.

6. A circuit as claimed in claim 5, wherein further comprising, for at least one of the first or second switch, a resistor between the control terminal and the body terminal.

7. An integrated circuit, comprising a bi-directional power transistor, the integrated circuit comprising:
    a transistor body control circuit for controlling a body of a bidirectional power transistor, the transistor body control circuit comprising:
    a first switch connectable between a body terminal and a first current terminal of the bidirectional power transistor, comprising a control terminal for controlling the current flowing through the first switch;
    a second switch connectable between the body terminal and a second current terminal of the bidirectional power transistor, comprising a control terminal for controlling the current flowing through the second switch;
    the control terminal of the first switch being connected to a first alternating current, AC capacitive voltage divider and the control terminal of the second switch being connected to a second AC capacitive voltage divider; said AC capacitive voltage dividers being connectable to the first control terminal and the second current terminal and arranged to control the first switch and the second switch to switch the voltage of the body terminal to the first current terminal or the second current terminal as a function of the voltage between the first current terminal and the second current terminal;
    the integrated circuit further comprising a bi-directional power transistor connected with a body to said body terminal, with said first current terminal to a drain terminal and with a second current terminal to a source terminal.

8. An integrated circuit as claimed in claim 7, wherein the bi-directional power transistor comprises:
    a substrate with a substrate top surface;
    a layer stack extending over the substrate top surface, in which stack a first vertical trench and a second vertical trench are present, each of said vertical trenches extending in a vertical direction from a top layer of the stack towards the substrate;
    an electrical path which can be selectively enabled or disabled to allow current to flow in a first direction or a second direction, opposite to the first direction, between the drain terminal and the source terminal, the electrical path comprising:
    wherein the drain terminal is situated, in said vertical direction, below the source terminal and the source terminal being situated on or above the top layer; and the body extends laterally between the first and second vertical trenches and vertically between said drain terminal and said source terminal;
    the electrical path comprising: the body, a first drift region extending, in said vertical direction, between the body and the drain terminal, and a second drift region extending, in said vertical direction, between the body and the source terminal.

9. The integrated circuit as claimed in claim 8, comprising a control die on which the transistor body control circuit is provided and a power die on which the bi-directional power transistor is provided.

10. The integrated circuit as claimed in claim 7, where the AC capacitive voltage dividers both comprise a series connection of a resistor connectable to a respective current terminal of the transistor and at least two capacitive elements in series, a node between said capacitive elements being connected to the control terminal.

11. The integrated circuit as claimed in claim 10, wherein at least one of the first or second AC capacitive voltage divider comprises a diode, a cathode of said diode being connected to said resistor and an anode of said diode being connected to said node.

12. The integrated circuit as claimed in claim 7, wherein for at least one of the first or second AC capacitive voltage divider a capacitive part of the switch to which the divider is connected forms a capacitive element of said AC capacitive voltage divider connecting the control terminal and the respective current terminal.

13. The integrated circuit as claimed in claim 7, further comprising clamp circuitry for clamping the control terminals relative to said body terminal to below the breakdown voltage of the control terminal.

14. The integrated circuit as claimed in claim 13, wherein further comprising, for at least one of the first or second switch, a resistor between the control terminal and the body terminal.

15. The integrated circuit as claimed in claim 7, wherein the bi-directional power transistor has a breakdown voltage of at least 25 V and the first or second switch has a breakdown voltage below 10 V.

16. The integrated circuit as claimed in claim 7, wherein the bi-directional power transistor has a breakdown voltage from the drain terminal to the source terminal of at least 40 V and in reverse direction from the source terminal to the drain terminal of at least 25 V.

17. The integrated circuit as claimed in claim 16, wherein the breakdown voltage from the drain terminal to the source terminal is higher than in the reverse direction.

18. The integrated circuit as claimed in claim 7, wherein the AC capacitive divider has a division ratio which varies depending on a polarity of the voltage across the AC capacitive divider.

19. A circuit as claimed in claim 2, wherein for at least one of the first or second AC capacitive voltage divider a capacitive part of the switch to which the divider is connected forms a capacitive element of said AC capacitive voltage divider connecting the control terminal and the respective current terminal.

20. A circuit as claimed in claim 3, wherein for at least one of the first or second AC capacitive voltage divider a capacitive part of the switch to which the divider is connected forms a capacitive element of said AC capacitive voltage divider connecting the control terminal and the respective current terminal.

* * * * *